US008798942B2

(12) United States Patent
Greiser et al.

(10) Patent No.: US 8,798,942 B2
(45) Date of Patent: Aug. 5, 2014

(54) METHOD AND DEVICE FOR PHASE-SENSITIVE FLOW MEASUREMENT BY A MAGNETIC RESONANCE

(75) Inventors: Andreas Greiser, Erlangen (DE); Edgar Mueller, Heroldsbach (DE); Michael Zenge, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 525 days.

(21) Appl. No.: 12/975,840

(22) Filed: Dec. 22, 2010

(65) Prior Publication Data

US 2011/0153231 A1 Jun. 23, 2011

(30) Foreign Application Priority Data

Dec. 22, 2009 (DE) .......................... 10 2009 055 122

(51) Int. Cl.
*G01F 1/00* (2006.01)
*G01F 7/00* (2006.01)
*A61B 5/05* (2006.01)
*G01V 3/00* (2006.01)

(52) U.S. Cl.
USPC ............. 702/49; 600/410; 600/415; 600/419; 324/307; 324/309

(58) Field of Classification Search
USPC ............. 702/49; 600/410, 415, 419; 324/306, 324/307, 309; 378/128, 130, 131, 132, 4, 5, 378/8, 98.9, 98.11, 98.12
See application file for complete search history.

(56) References Cited

U.S. PATENT DOCUMENTS

| 6,408,201 | B1 | 6/2002 | Foo et al. |
| 7,312,610 | B2 | 12/2007 | Harder |
| 2004/0113616 | A1* | 6/2004 | Markl et al. ................... 324/307 |
| 2005/0119557 | A1* | 6/2005 | Meaney et al. ............... 600/410 |
| 2007/0016002 | A1* | 1/2007 | Mayer et al. .................. 600/410 |
| 2008/0024127 | A1 | 1/2008 | Nagao et al. |
| 2010/0079141 | A1* | 4/2010 | Stemmer ....................... 324/309 |
| 2010/0189328 | A1* | 7/2010 | Boernert et al. .............. 382/131 |

OTHER PUBLICATIONS

"Variable Field of View for Spatial Resolution Improvement in Continuously Moving Table Magnetic Resonance Imaging," Hu et al., Magnetic Resonance in Medicine, vol. 54 (2005) pp. 146-151.

* cited by examiner

*Primary Examiner* — John Breene
*Assistant Examiner* — Manuel Rivera Vargas
(74) *Attorney, Agent, or Firm* — Schiff Hardin LLP

(57) ABSTRACT

In a method and a device for phase-sensitive flow measurement of a volume segment of an examination subject in a measurement system, the volume segment is divided into multiple partial volume segments and the following steps are executed repeatedly until the volume segment has been completely measured: movement of a table such that a center of one of the partial volume segments to be measured essentially corresponds to the isocenter of the magnetic resonance system, and implementation of the phase-sensitive flow measurement for the partial volume segment to be measured while the center of the partial volume segment essentially corresponds to the isocenter.

17 Claims, 7 Drawing Sheets

FIG 4
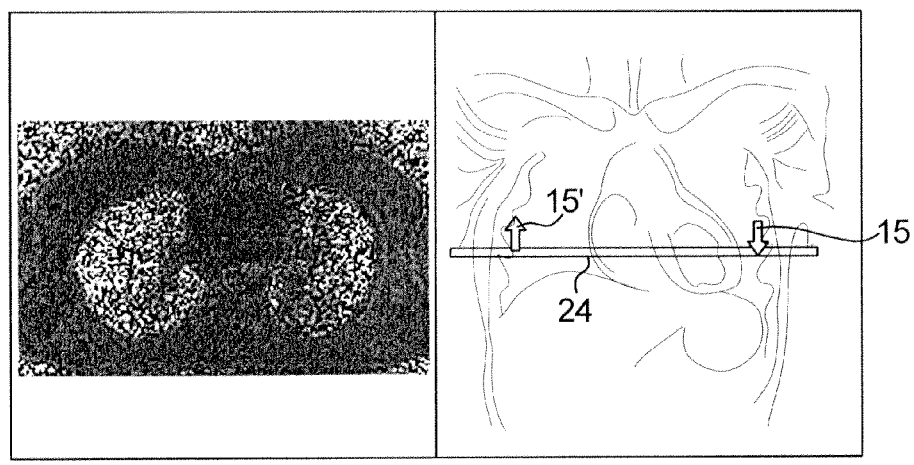
FIG 5
a)
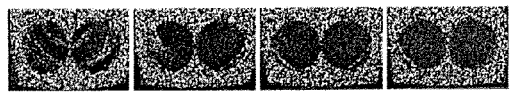
b)

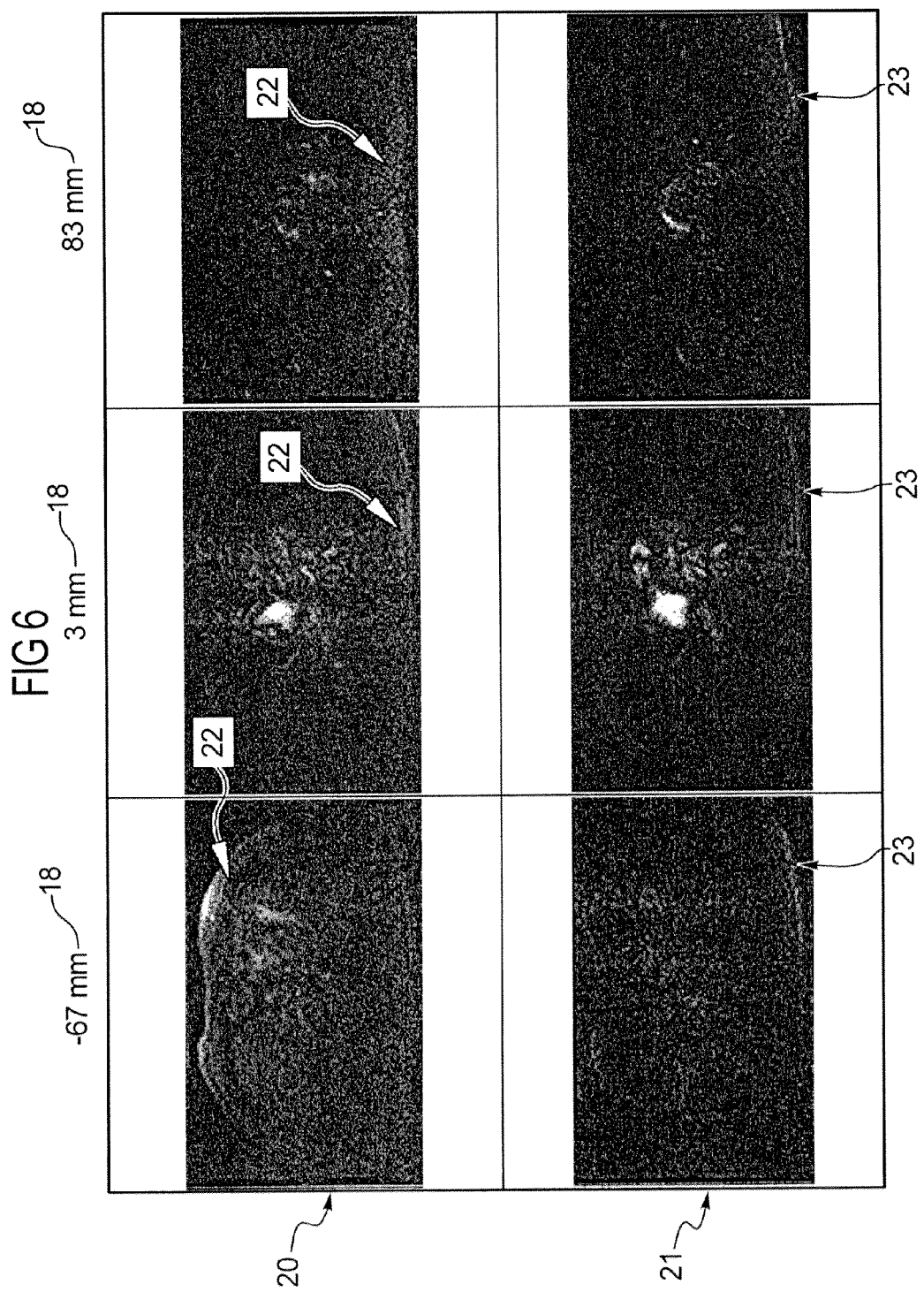

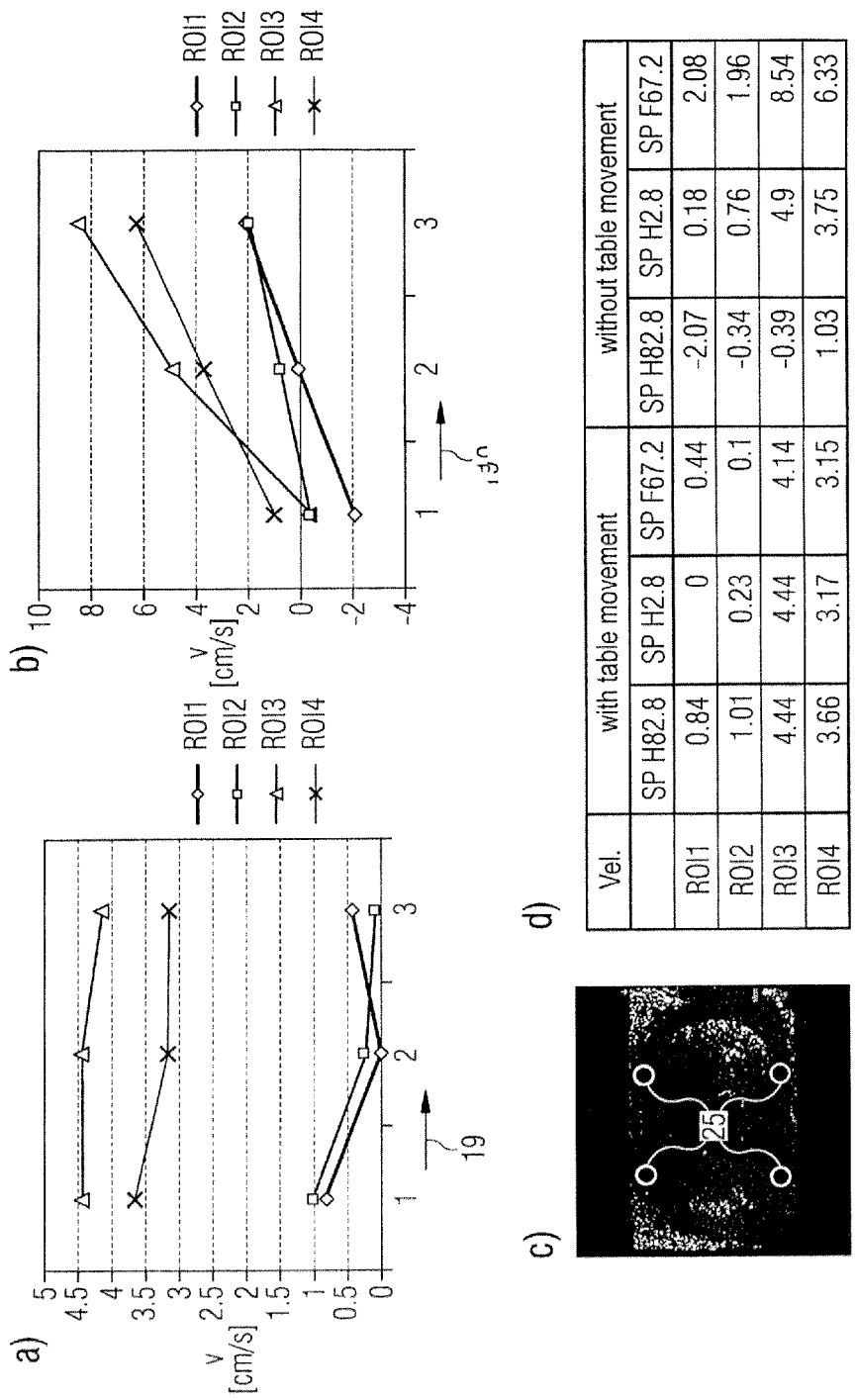

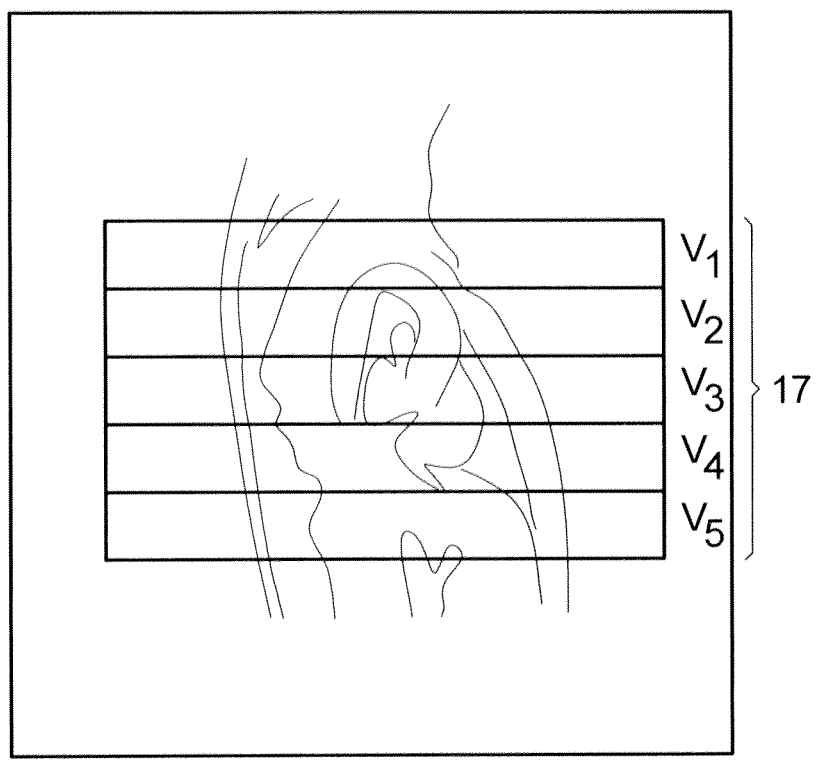

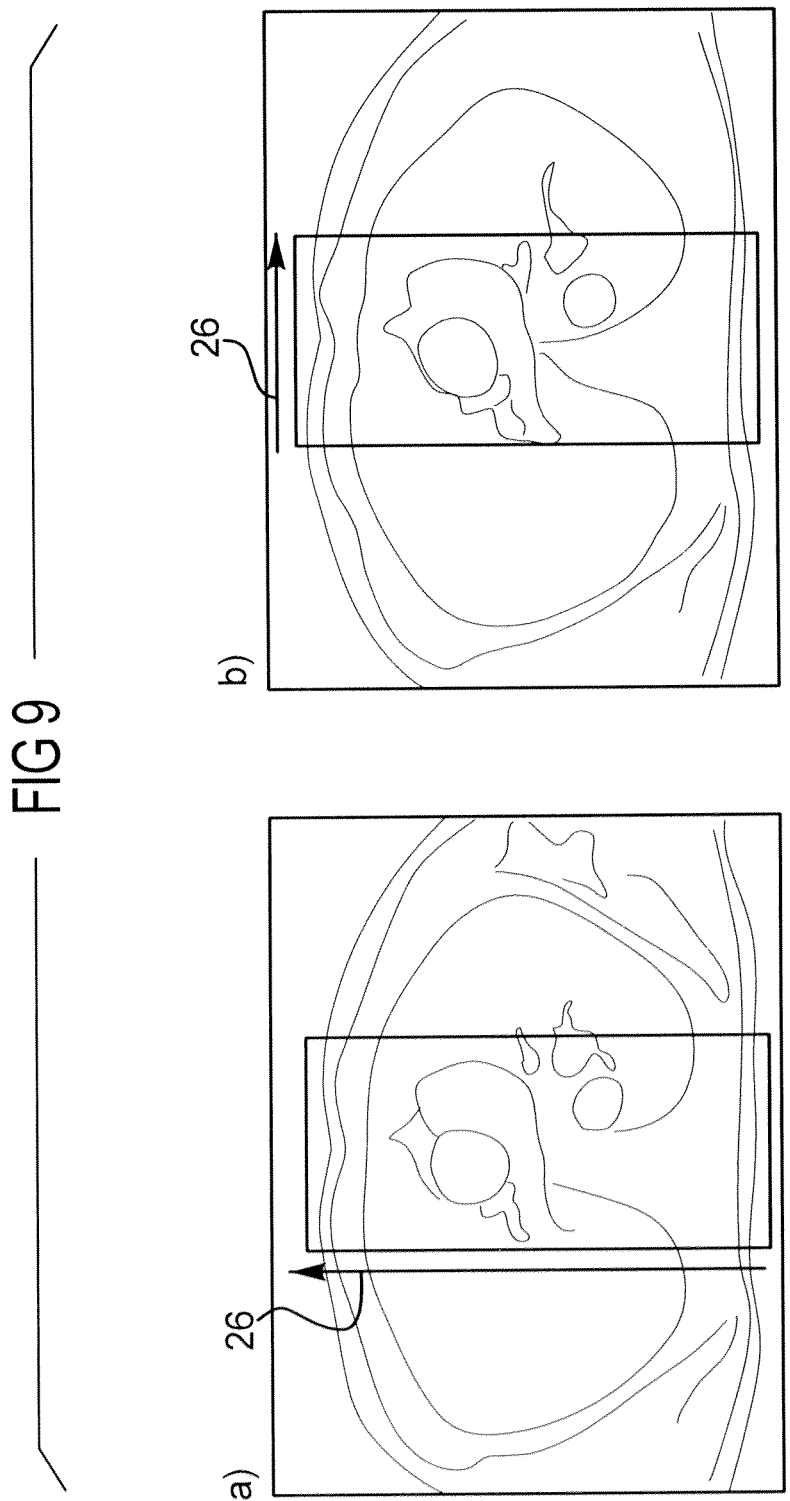

METHOD AND DEVICE FOR PHASE-SENSITIVE FLOW MEASUREMENT BY A MAGNETIC RESONANCE

BACKGROUND OF THE INVENTION

1. Field of the Invention

The present invention concerns a method and a device for phase-sensitive flow measurement by means of a volume segment of an examination subject for a magnetic resonance system.

2. Description of the Prior Art

In phase-sensitive flow measurements or phase contrast flow measurements conducted with a magnetic resonance system, bipolar gradients are switched (activated) to encode a flow for measurement of the flow of tissue fluids (for example blood). These bipolar gradients lead to eddy current effects. These eddy current effects lead to background phase that in MR images containing velocity information, which are also called phase images, superimposes on the actual velocity information and therefore causes an adulterated flow velocity depiction. In other words, the background phase adulterates the quantitative information that is to be evaluated to measure flow and velocity values. An additional source of error is the gradient non-linearity. In addition to errors in the spatial association of the measured signal, or the measured MR data, this gradient non-linearity leads to errors in the flow coding, which likewise negatively affects the measurement of flow and velocity values. These two effects (eddy current effects, gradient non-linearity) increase with the distance from the isocenter of the magnetic resonance system and can already cause significant error contributions at distances of a few centimeters from the isocenter.

According to the prior art it is sought to avoid these two effects in flow measurements by positioning the image regions of interest (vessels, for example) as close as possible to the isocenter. With regard to the z-direction, given a predetermined position of the examination subject on the table of the magnetic resonance system it is possible by displacement of the patient table or by another technique, to place the image region to be acquired optimally close to the isocenter. This approach according to the prior art is able to keep the consequences of the two effects small only if image regions are measured with a correspondingly small extent in the z-direction. However, if the region to be measured (i.e, the region from which image data are to be acquired) encompasses an image region with a larger extent in the z-direction (for example more than 10 cm), the consequences of the two effects can be kept small only for a portion of the region that lies in the center of the image region to be measured, while the background phase effects are unavoidable in other regions that lie far removed from the isocenter.

Due to the increasing importance of flow measurements with volumetric coverage, for example "4D Flow" (generation of velocity information over time in a three-dimensional space), the correction or avoidance of the errors occurring due to the background phase effects becomes ever more important. According to the prior art image-based corrections are known via which the errors in the background phase and errors also generated by the gradient non-linearity can be corrected, but only partially.

SUMMARY OF THE INVENTION

An object of the present invention is to implement a phase-sensitive flow measurement such that the negative consequences of the exposure effects and the gradient non-linearity are less than occur in prior art techniques.

Within the scope of the present invention, a method is provided for phase-sensitive flow measurement of a volume segment of an examination subject (for example a patient) by means of a measurement system. In a first step of this method the volume segment to be examined is subdivided into multiple partial volume segments.

After the division of the volume segment into multiple partial volume segments, the following steps are executed repeatedly until all MR data of the volume segment have been completely acquired:

A table of the magnetic resonance system is moved such that a center of one of the partial volume segments which is currently to be measured essentially corresponds to the isocenter of the magnetic resonance system.

Implementation of the phase-sensitive flow measurement for the current partial volume segment to be measured while the center of this partial volume segment is essentially located in the isocenter.

If the center of that partial volume segment which is currently measured is essentially located in the isocenter, and if the dimensions of each partial volume segment—in particular in the measurement direction (z-direction, for example)—are below a predetermined threshold (for example 10 cm, better 5 cm), meaning that the dimension of each partial volume segment in the measurement direction amounts to not more than 10 cm (5 cm), the effects of the eddy currents and the gradient non-linearity are sufficiently small so that it is possible to implement a correct flow measurement. The measurement direction thereby in particular corresponds to the direction (z-direction) of the basic magnetic field $B0$ of the magnetic resonance system.

In other words, the thickness of each volume segment in the direction of the basic magnetic field $B0$ is in particular chosen to be very narrow (10 cm or less) in order to measure every slice of the respective volume segment in proximity to the isocenter ($z=0$) in order to thereby minimize background phase effects and other locally varying influences (for example gradient distortions).

The center of a partial volume segment means the center point of the partial volume segment. The center of a partial volume segment essentially corresponds to the isocenter if the distance between the center of the partial volume segment and the isocenter in particular is below a predetermined distance (1 cm, for example) in the measurement direction. The measurement direction is the direction hat lies parallel to the surface normals of the slices given two-dimensional measurement or parallel to the surface normals of the boundary surfaces between two adjacent partial volume segments given a three-dimensional measurement. Naturally, it is also sought that the center of the partial volume segment to be measured essentially corresponds to the isocenter in directions perpendicular to the measurement direction. This is the case if the distance between the center of the partial volume segment and the isocenter is below an additional predetermined distance (3 cm, for example) in a direction perpendicular to the measurement direction.

If the phase-sensitive flow measurement is implemented with a two-dimensional measurement method, each of the partial volume segments possesses one or more slices. To implement the phase-sensitive flow measurement for each partial volume segment the table is displaced such that each of these slices of the partial volume segment exhibits a distance from the isocenter which is below a predetermined maximum distance. If the slices are arranged uniformly in the partial volume segment, this is the case when the center of the partial volume segment corresponds to the isocenter. The maximum distance thereby significantly depends on the magnetic resonance system. In modern magnetic resonance systems, the maximum distance should not be greater than 5.0 cm (better 2.5 cm).

The number of slices contained in the respective partial volume segment depends on the intended duration of the flow measurement for the volume segment in addition to the compliance with the maximum distance. The best results are achieved if each partial volume segment comprises only one slice. In this case the table is moved before the flow measurement for each slice such that the isocenter lies within the slice. However, the duration of the flow measurement also increases with the number of table movements during the flow measurement.

Since the slices of the current partial volume segment to be measured exhibit only a predetermined maximum distance from the isocenter, it is ensured that—in a phase-sensitive flow measurement of each slice within the partial volume segment—neither the eddy current effects nor the gradient non-linearity leads to excessive consequences with regard to the measurement of flow and velocity values.

The present invention is particularly suitable for an axial slice direction data acquisition. In an axial slice direction data acquisition, the surface normals of the slices to be measured lie parallel to the z-direction. In a three-dimensional measurement method the axial slice direction corresponds to an arrangement of the three-dimensional partial volume segments in series in the z-direction.

In comparison with an angulated measurement, a measurement with axial slice duration normally lasts longer since the angulated measurement can optimally cover the measurement volume of interest. However, the angulated measurement (which is not conducted along the axial, sagittal or coronal direction but rather at an angle to these directions) requires a certain preparation time for planning of the measurement which is not required given the axial slice duration according to the invention, and therefore can be spared. The position of the axial slice stack (of the volume segment with slices along the axial direction) within the examination subject can be directly based on results which have been achieved by a coronally or sagittally operating localizer that is typically used before a flow measurement (independent of whether it is a flow measurement according to the prior art or one according to the invention). In other words, a flow measurement according to the invention with axial slice direction does not require any additional intermediate steps or preparation steps which, for example, are necessary for planning of angulated measurements, such that the total duration of the flow measurement according to the invention is on average not more than the total duration of an angulated measurement, in spite of a longer duration of the actual flow measurement.

Moreover it is noted that—given a slice orientation or slice direction in the primary physical directions (i.e. axial, sagittal or coronal)—an intensification of the eddy current effects, which otherwise occur due to a coupling of multiple gradient orders given doubly-angulated two-dimensional single-slice measurements is minimized.

According to the invention, an adjustment (a calibration of the magnetic resonance system) that is necessary for the different table positions can be integrated into the measurement protocol in the following two ways:

The adjustment is implemented at the beginning of the measurement for a partial volume segment. This means that after a measurement of a specific partial volume segment the table is moved for the measurement of the next partial volume segment and the adjustment for the measurement of this next partial volume segment is implemented before the actual flow measurement begins for this next partial volume segment.

At the beginning of the total measurement a respective adjustment for all table positions that are used later is measured or determined in a pre-measurement, meaning that the adjustments are determined before the actual flow measurement begins at the first table position.

In order to optimize the efficiency of the flow measurement according to the invention, the method according to the invention can be combined with a method for selective excitation. A method operating with two-dimensional, selective RF pulses and the transmit array or transmission array technique are two examples of such a method for selective excitation. According to these methods only regions of interest within a slice to be measured or within a volume to be measured are excited, such that the number of necessary phase coding steps can be reduced in comparison to a method in which the total slice or the total volume is excited.

Since, particularly for an axial slice direction, the slices to be measured cannot be optimally adapted to a region of interest (for example a vessel like the aorta), as this is the case given the angulated measurement described in the preceding, via the selective excitation more phase coding steps by percentile can be spared in comparison to the angulated measurement. This is based on the fact that the proportion of regions of interest per slice is smaller (due to the non-optimal adaptation of the slices) than is the case given optimally adapted slices (as in an angulated measurement). If the proportion of regions of interest per slice is low, fewer regions must also be selectively excited as a consequence.

As indicated above, the phase-sensitive flow measurement according to the invention can be implemented either with a three-dimensional measurement (three-dimensional k-space) or with a two-dimensional measurement (two-dimensional k-space).

In a comparison between the three-dimensional measurement and the two-dimensional multislice measurement, the three-dimensional measurement apparently has a higher signal-to-noise ratio. However, given a flow measurement it must be considered that the signal of a moving fluid is significantly intensified by an effect known as the inflow effect. Since the saturation of the moving fluid within the measurement volume is greater in the case of a three-dimensional measurement method than the saturation of the moving fluid within the measured slice in the case of a two-dimensional method, the contrast between the moving fluid and other measurement points is advantageously greater in the two-dimensional measurement method than in the three-dimensional measurement method. Moreover, a problem due to a disadvantageous volume profile in the z-direction is not present in the two-dimensional measurement. In summary, in specific applications a two-dimensional measurement according to the invention is not inferior to a three-dimensional measurement according to the invention in terms of scanning efficiency and image quality.

The present invention also encompasses a device provided for a magnetic resonance system for phase-sensitive flow measurement of a volume segment of an examination subject. The device has an activation unit to activate the magnetic resonance system, a receiver device to receive MR data acquired by the magnetic resonance system within the volume segment, and an evaluation device to evaluate the MR data. After the volume segment is divided up into multiple partial volume segments by means of the device, the device executes the following until the volume segment has been completely measured.

The device moves the table of the magnetic resonance system such that a center of one of the partial volume segments to be measured lies essentially in the isocenter of the magnetic resonance system. The device subsequently activates the magnetic resonance system via the activation device such that the device implements the phase-sensitive flow measurement for the partial volume segment to be measured while the center of this partial volume segment to be measured is located in the isocenter.

The advantages of the device according to the invention essentially correspond to the advantages of the method according to the invention, and this need to be repeated.

The present invention also encompasses a non-transitory computer-readable storage medium, for example a DVD, a magnetic tape or a USB stick, on which is stored electronically readable control information (programming instructions), in particular software. When this control information (software) is read from the data medium and stored in a controller or computer of a magnetic resonance system, all embodiments of the method described in the preceding can be implemented.

The software can be source code (C++, for example) that must still be compiled or linked or that only must be interpreted, or can be executable software code that is only to be loaded into the corresponding computer for execution.

The present invention is particularly suitable for a phase-sensitive flow measurement by means of a magnetic resonance system. Naturally, the present invention is not limited to this preferred application field since the present invention can also be used in angiography, for example.

BRIEF DESCRIPTION OF THE DRAWINGS

FIG. 4 is used to explain a procedure for phase-sensitive flow measurement according to the invention.

FIGS. 5 through 7 show results of the method according to the invention in comparison to the prior art.

FIG. 8 illustrates a three-dimensional measurement method according to the invention.

FIG. 9 shows results of a method with selective excitation according to the invention.

DESCRIPTION OF THE PREFERRED EMBODIMENTS

Figure 1:
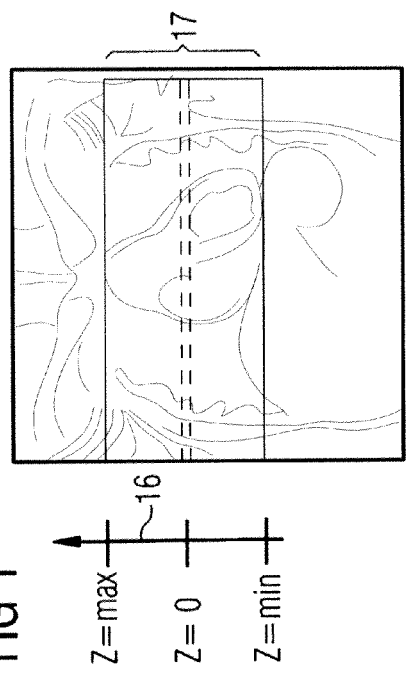
FIG. 1 illustrates a method for flow measurement according to the prior art.

According to the prior art, in a phase-sensitive flow measurement a volume segment 17 to be measured is arranged in the isocenter of a magnetic resonance system, as is shown in FIG. 1. Since the subsequently implemented flow measurement is implemented without a table feed, the outer layers of the volume segment 17 exhibit too large a distance from the isocenter in the z-direction 16, which leads to negative consequences due to eddy current effects and gradient non-linearity.

Figure 2:
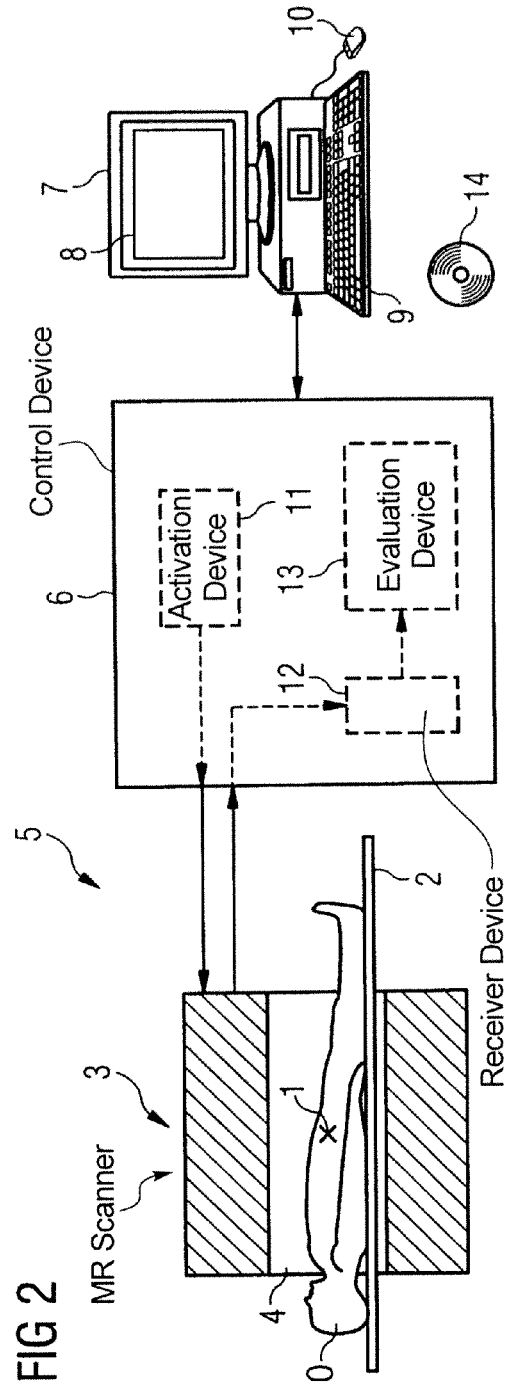
FIG. 2 schematically shows a magnetic resonance system according to the invention with a device according to the invention.

A magnetic resonance system 5 according to the invention is schematically shown in FIG. 2. The magnetic resonance system 5 has a scanner 3 with which the magnetic field necessary for the MR examination is generated in a measurement space; a table 2; a control device 6 according to the invention with which the scanner 3 is controlled and MR data are received from the scanner 3; and a terminal 7 connected to the control device 6.

The control device 6 includes an activation unit 11, a receiver device 12 and an evaluation device 13. During a phase-sensitive flow measurement, MR data are acquired by the receiver device 12 by the scanner 3, with the scanner 3 and the table 2 activated by the activation unit 11 such that MR data are acquired in a measurement volume which is located inside the body of a patient O situated on the table 2.

The evaluation device 13 then prepares the MR data such that they can be graphically presented on a monitor 8 of the terminal 7, and such that images created according to the invention can be displayed. In addition to the graphical depiction of the MR data, with the terminal 7 (which has a keyboard 9 and a mouse 10 in addition to the monitor 8) a three-dimensional volume segment to be measured can be predetermined by a user and additional parameters for implementation of the method according to the invention can be defined, for example. The software for the control device 6 can also be loaded into said control device 6 (in particular into the evaluation device 13) via the terminal 7. This software of the control device 6 can thereby also comprise the method according to the invention. It is also possible for a method according to the invention to be embedded in software that runs in the terminal 7. Independently of the software in which the method according to the invention is embodied, the software can be stored on a DVD 14 so that this software can then be read from the DVD 14 by the terminal 7 and be copied either into the control device 6 or into a computer of the terminal 7 itself.

Figure 3:
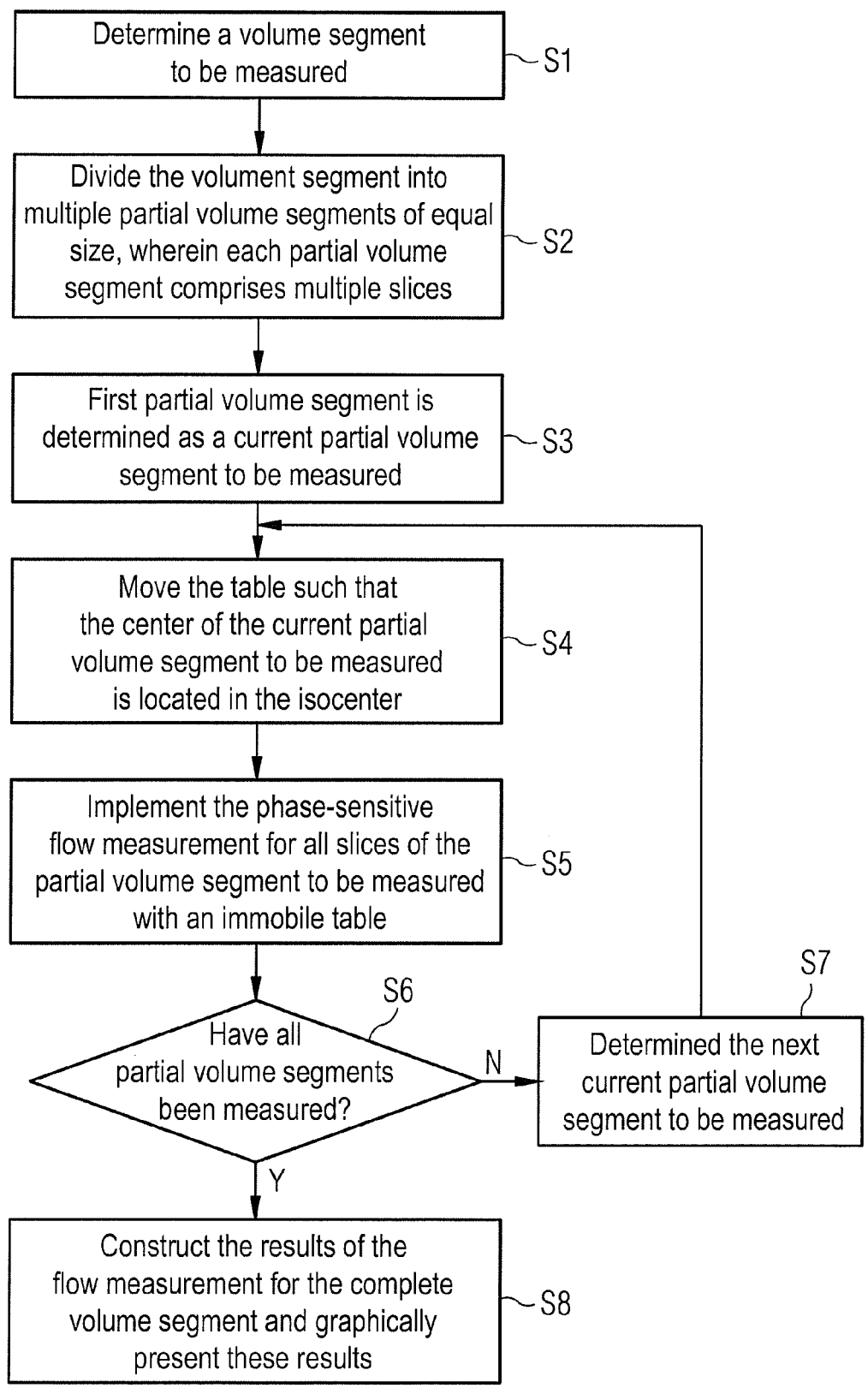
FIG. 3 is a flow chart of an embodiment of the method according to the invention.

A flow plan of a method according to the invention is shown in FIG. 3. The method begins at Step S1, in which a volume segment is determined in which a flow measurement is to be implemented.

In the following Step S2 this volume segment is divided up into multiple partial volume segments which respectively have the same volume. Each of these partial volume segments thereby comprises multiple slices since the flow measurement is implemented in the form of a two-dimensional measurement.

In the third Step S3 the first partial volume segment (which is reasonably located at the start of the volume segment) is determined as a first partial volume segment that is currently to be measured.

In the fourth Step S4, the table 2 is moved such that the center of the current partial volume segment to be measured is located in the isocenter of the magnetic resonance system 5.

In the fifth Step S5, the phase-sensitive flow measurement is implemented for each slice within the current partial volume segment to be measured. The table 2 is thereby not moved. The size of the partial volume segments is thereby dimensioned such that the MR measurement of each slice is implemented with sufficient density at the isocenter 1 so that background phase effects and other locally varying influences such as gradient distortions are minimal.

In the sixth Step S6 it is checked whether all partial volume segments of the volume segment have been measured.

If not all partial volume segments of the volume segment have been measured yet, the method according to the invention branches to Step S7, and in this Step S7 the next partial volume segment to be measured (which next partial volume segment is arranged next to the presently measured partial volume segment) is determined. The method is subsequently continued again in Step S4.

If the query implemented in Step S6 yields that all partial volume segments of the volume segment have already been measured, the method according to the invention branches to Step S8. In this Step S8 the results of the flow measurement of the individual partial volume segments are merged and a graphical representation of these combined results is prepared and ultimately generated. The method according to the invention then ends.

A basis of the method according to the invention for phase-sensitive flow measurement is shown with FIG. 4. After the last slice of a partial volume segment has been measured, the table is displaced along the z-direction such that the center of the partial volume segment that is to be measured next lies in the isocenter. The arrow marked with the reference character 15' in FIG. 4 reflects the direction and (with its length) the magnitude of the movement of the table. This movement of the table leads to a corresponding variation of the slice positions which is represented by the arrow marked with the reference character 15 in FIG. 4. Expressed in another way, the movement of the table between the measurement of the last slice of a partial volume segment and the measurement of the first slice of the next partial volume segment must be compensated by a corresponding displacement of the current slice to be measured, which displacement is represented with the arrow 15.

The method according to the invention is compared with a method according to the prior art in FIG. 5. For this a phase contrast of a homogeneous bottle filled with water is measured given axial slice direction for various slice positions (different positions in the z-direction). If no eddy current effects and no gradient non-linearity at all were to occur, the region representing the water in the MR images would have to be medium grey in all slices. It is apparent that the MR images designed (b) in FIG. 5, which have been created with the method according to the invention (thus with a table movement during the complete measurement), come significantly closer to the optimal medium grey color tone than the MR images designated (a) in FIG. 5, which have been acquired with a method according to the prior art without table movement.

The method according to the invention is compared with a method according to the prior art in FIG. 6. For this purpose, given axial slice direction an angiography contrast image of a thorax including a heart in the image center of three images with a method according to the prior art (without table movement) 20 is shown for three different slice positions (the corresponding slice offset in the z-direction is respectively indicated with the reference character 18), and three corresponding images with a method according to the invention (with table movement 21) is shown. In the images the upper and lower regions of the respective image show an immobile tissue (in comparison to a tissue in the image center that moves due to the cardiac activity). A strong background signal which varies depending on the slice position is apparent at the points (indicated with the reference character 22) in the three upper images which have been generated with a method according to the prior art. In contrast to this, only a weak background signal which is independent of the slice position—i.e. does not vary with the slice position—is apparent at the corresponding points 23 in the images generated with the method according to the invention.

In FIG. 7 a phase-sensitive flow measurement is conducted at four points which are indicated in the image designated (c) in FIG. 7 using circles 25. It is taken into account that no flow occurs at the points 25, such that a flow velocity of 0 cm/s should be measured for all four points or regions 25 given a correct flow measurement. The flow measurement is implemented with a method according to the prior art, and with a method according to the invention, for three slices, i.e. for three different slice positions. The results are shown in the table designated (d) in FIG. 7 and in graphical form in the graph designated (a) in FIG. 7 for the method according to the invention and in the graph designated (b) in FIG. 7 for the method according to the prior art. The flow velocity (more precisely the flow velocity errors, since the flow velocity should optimally amount to 0 cm/s) is thereby shown on the y-axis in graphs (a) and (b) and the slice positions in the z-direction are shown on the x-axis 19.

It is apparent that the flow velocities detected according to the invention are on the one hand lower in comparison to the results according to the prior art (see graph (b). The flow velocities in the method according to the invention are nearly independent of the slice position (i.e. they hardly vary with the slice position), such that the corresponding errors can be corrected more simply via downstream methods.

The cause of the different results in the method according to the invention (and also in the method according to the prior art) for the different regions 25 is to be sought in the different offset of the four regions 25 from the isocenter relative to the x-direction and relative to the y-direction.

If the MR data of a partial volume segment are acquired via a three-dimensional measurement method (three-dimensional k-space), the partial volume segment possesses a single slice whose measurements correspond to the partial volume segment itself.

The method according to the invention given a three-dimensional measurement of the volume segment 17 to be measured is shown in FIG. 8. The volume segment 17 is divided into five equally large partial volume segments $V_1$-$V_5$. The volume segment 17 is thereby divided into the partial volume segments such that the boundary surface between two adjacent partial volume segments respectively exhibits a surface perpendicular which is parallel to the z-direction of the magnetic resonance system. In the division of the volume segment 17, an extent of each partial volume segment $V_1$-$V_5$ is selected such that this extent is less than a predetermined threshold (10 cm, for example, better 5 cm).

To acquire the MR data of one of the partial volume segments $V_1$-$V_5$, the corresponding partial volume segment $V_i$ is arranged such that a center point of the partial volume segment $V_i$ optimally exhibits no distance from the isocenter in the z-direction. It would be particularly advantageous if the center point of the partial volume segment $V_i$ corresponds to the isocenter.

Since the extent of each partial volume segment $V_i$ in the z-direction is not greater than the predetermined threshold, it is ensured that no measurement point within the partial volume segment $V_i$ is further removed in the z-direction from the isocenter than half of the predetermined threshold. It is thereby advantageously ensured that the consequences of eddy currents and a gradient non-linearity are slight.

Results of implementation of a method according to the invention are shown in FIG. 9, wherein a selective excitation is worked with in order to reduce the measurement time for the individual slice and therefore to reduce the measurement time for the individual slice and with this the total measurement duration for phase-sensitive flow measurement according to the invention. A phase coding direction 26 in the anterior-posterior direction (see FIG. 9a) is necessary in order to avoid aliasing in the right-left direction. Given a phase coding direction 26 in the right-left direction, a limited excitation based on two-dimensional, selective radio-frequency pulses or a transmit array technique.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for phase-sensitive flow measurement of a volume segment of an examination subject by magnetic resonance imaging, comprising the steps of:
    in a computerized control system that operates a magnetic resonance data acquisition unit, having an isocenter, in which an examination subject containing a volume segment from which magnetic resonance data are to be acquired is located, dividing said volume segment into a plurality of partial volume segments, each having a center, to cause a thickness of each of said partial volume segments, in a direction of a basic magnetic field generated by the data acquisition unit, to not exceed 10 cm;
    operating said magnetic resonance data acquisition unit from said computerized control unit to repeatedly execute the following steps for each of said partial volume segments until magnetic resonance data have been acquired from an entirety of said volume segment:
        moving a table, on which the examination subject is located, through the data acquisition unit to cause the center of one of said partial volume segments, from which magnetic resonance data are to be acquired, to substantially coincide with the isocenter of the data acquisition unit,
        implementing a phase-sensitive flow measurement, in which gradient magnetic fields are activated, in order to acquire phase-sensitive magnetic resonance data representing a flow of nuclear spins in said examination volume from an entirety of said one of said partial volume segments while movement of said table is temporarily ceased in order to maintain said center of said one of said partial volume segments substantially coincident with the isocenter of the data acquisition unit during acquisition of all of said magnetic resonance data from said entirety of said one of said partial volume segments, and
        said thickness of each of said partial volume segments not exceeding 10 cm reducing, when said center of said one of said partial volume segments is substantially coincident with the isocenter of the data acquisition unit, effects of any non-linearities of said gradient magnetic fields, and any eddy currents produced by said gradient magnetic fields, on the acquired magnetic resonance data.

2. A method as claimed in claim 1 wherein each of the partial volume segments comprises at least one slice, and moving said table to cause said at least one slice of said one of said partial volume segments to be located at a distance from said isocenter that is less than a predetermined maximum distance, and implementing said flow-sensitive flow measurement for said at least one slice as long as said at least one slice exhibits said distance from the isocenter that is less than said predetermined maximum distance.

3. A method as claimed in claim 2 comprising setting said predetermined maximum distance to be less than 5.0 cm.

4. A method as claimed in claim 1 comprising, in said computerized control unit, determining a table position of said table for each of said plurality of partial volume segments that is necessary to respectively implement said flow-sensitive flow measurement before beginning implementation of said flow-sensitive flow measurement.

5. A method as claimed in claim 4 comprising determining the respective table positions in a pre-measurement for respectively different table positions before beginning to acquire data from said volume segment.

6. A method as claimed in claim 1 comprising repeatedly executing said steps with an axial slice direction.

7. A method as claimed in claim 1 comprising implementing selective excitation of nuclear spins in the respective partial volume segments in combination with implementing said phase-sensitive flow measurement.

8. A method as claimed in claim 1 comprising implementing said flow-sensitive flow measurement for each of said partial volume segments in a data acquisition procedure selected from the group consisting of three-dimensional data acquisition procedures, and two-dimensional multi-slice procedures.

9. A device for phase-sensitive flow measurement of a volume segment of an examination subject by magnetic resonance imaging, comprising the steps of:
    a computerized control system configured to operate a magnetic resonance data acquisition unit, having an isocenter, in which an examination subject containing a volume segment from which magnetic resonance data are to be acquired is located, said computerized control system being configured to divide said volume segment into a plurality of partial volume segments, each having a center, to cause a thickness of each of said partial volume segments, in a direction of a basic magnetic field generated by the data acquisition unit, to not exceed 10 cm;
    said computerized control system being configured to operate said magnetic resonance data acquisition unit from said computerized control unit to repeatedly execute the following steps for each of said partial volume segments until magnetic resonance data have been acquired from an entirety of said volume segment:
        moving a table, on which the examination subject is located, through the data acquisition unit to cause the center of one of said partial volume segments, from which magnetic resonance data are to be acquired, to substantially coincide with the isocenter of the data acquisition unit,
        implement a phase-sensitive flow measurement, in which gradient magnetic fields are activated, in order to acquire phase-sensitive magnetic resonance data representing a flow of nuclear spins in said examination volume from one entirely of said one of said partial volume segments while movement of said table is temporarily ceased in order to maintain said center of said one of said partial volume segments substantially coincident with the isocenter of the data acquisition unit during acquisition of all of said magnetic resonance data from said entirety of said one of said partial volume segments, and
        said thickness of each of said partial volume segments not exceeding 10 cm reducing, when said center of said one of said partial volume segments is substantially coincident with the isocenter of the data acquisition unit, effects of any non-linearities of said gradient magnetic fields, and any eddy currents produced by said gradient magnetic fields, on the acquired magnetic resonance data.

10. A device as claimed in claim 9 wherein each of the partial volume segments comprises at least one slice, and wherein said computerized control system being configured to move said table to cause said at least one slice of said one of said partial volume segments to be located at a distance from said isocenter that is less than a predetermined maximum distance, and implement said flow-sensitive flow measurement for said at least one slice as long as said at least one slice exhibits said distance from the isocenter that is less than said predetermined maximum distance.

11. A device as claimed in claim 10 wherein said computerized control system being configured to set said predetermined maximum distance to be less than 5.0 cm.

12. A device as claimed in claim 9 wherein said computerized control system being configured to determine a table position of said table for each of said plurality of partial volume segments that is necessary to respectively implement said flow-sensitive flow measurement before beginning implementation of said flow-sensitive flow measurement.

13. A device as claimed in claim 12 wherein said computerized control system being configured to determine the respective table positions in a pre-measurement for respectively different table positions before beginning to acquire data from said volume segment.

14. A device as claimed in claim 9 wherein said computerized control system being configured to repeatedly execute said steps with an axial slice direction.

15. A device as claimed in claim 9 wherein said computerized control system being configured to implement selective excitation of nuclear spins in the respective partial volume segments in combination with implementing said phase-sensitive flow measurement.

16. A device as claimed in claim 9 wherein said computerized control system being configured to implement said flow-sensitive flow measurement for each of said partial volume segments in a data acquisition procedure selected from the group consisting of three-dimensional data acquisition procedures, and two-dimensional multi-slice procedures.

17. A non-transitory computer-readable storage medium encoded with programming instructions, said storage medium being loaded into a computerized control system of a magnetic resonance data acquisition unit having an isocenter and comprising a movable patient table that is movable through said data acquisition unit, said patient table having an examination subject thereon containing a volume segment from which magnetic resonance data are to be acquired, said programming instructions causing said computerized control unit to:

divide said volume segment into a plurality of partial volume segments, each having a center to cause a thickness of each of said partial volume segments, in a direction of a basic magnetic field generated by the data acquisition unit, to not exceed 10 cm;

operate said magnetic resonance data acquisition unit to repeatedly execute the following steps for each of said partial volume segments until magnetic resonance data have been acquired from an entirety of said volume segment:

move the table, on which the examination subject is located, through the data acquisition unit to cause the center of one of said partial volume segments, from which magnetic resonance data are to be acquired, to substantially coincide with the isocenter of the data acquisition unit, and implement a phase-sensitive flow measurement, in which gradient magnetic fields are activated, in order to acquire phase-sensitive magnetic resonance data representing a flow of nuclear spins in said examination volume from an entirety of said one of said partial volume segments while movement of said table is temporarily ceased in order to maintain said center of said one of said partial volume segments substantially coincident with the isocenter of the data acquisition unit during acquisition of all of said magnetic resonance data from said entirety of said one of said partial volume segments, and said thickness of each of said partial volume segments not exceeding 10 cm reducing, when said center of said one of said partial volume segments is substantially coincident with the isocenter of the data acquisition unit, effects of any non-linearities of said gradient magnetic fields, and any eddy currents produced by said gradient magnetic fields, on the acquired magnetic resonance data.

* * * * *